United States Patent [19]

Ito et al.

[11] Patent Number: 5,229,968
[45] Date of Patent: Jul. 20, 1993

[54] NONVOLATILE SEMICONDUCTOR MEMORY WHEREIN DUMMY CELLS ARE USED FOR GENERATING A POTENTIAL FOR DETECTING DATA

[75] Inventors: Makoto Ito, Yokohama; Nobutaka Kitagawa, Kawasaki, both of Japan

[73] Assignee: Kabushiki Kaisha Toshiba, Kawasaki, Japan

[21] Appl. No.: 630,842

[22] Filed: Dec. 20, 1990

[30] Foreign Application Priority Data

Dec. 22, 1989 [JP] Japan .................. 1-331126

[51] Int. Cl.[5] .............................. G11C 17/00
[52] U.S. Cl. ..................... 365/210; 365/189.07; 365/203; 365/205
[58] Field of Search .............. 365/210, 189.07, 203, 365/205

[56] References Cited

U.S. PATENT DOCUMENTS

| | | | |
|---|---|---|---|
| 4,340,943 | 7/1982 | Asano et al. | 365/210 X |
| 4,394,748 | 7/1983 | Campbell, Jr. | 365/104 |
| 4,644,501 | 2/1987 | Nagasawa | 365/203 |
| 4,819,212 | 4/1989 | Nakai et al. | 365/210 X |
| 4,972,378 | 11/1990 | Kitagawa et al. | 365/210 |
| 4,982,364 | 1/1991 | Iwahashi | 365/210 X |
| 5,001,668 | 3/1991 | Ito et al. | 365/189.09 |
| 5,067,111 | 11/1991 | Asano et al. | 365/189.07 X |

OTHER PUBLICATIONS

Tadashi Maruyama, et al., "Wide Operating Voltage Range and Low Power Consumption EPROM Structure for Consumer Oriented ASIC Applications", IEEE 1988 Custom Integrated Circuits Conference, pp. 4.1.1–4.1.4, 1988.

*Primary Examiner*—Eugene R. LaRoche
*Assistant Examiner*—Do Hyun Yoo
*Attorney, Agent, or Firm*—Finnegan, Henderson, Farabow, Garrett & Dunner

[57] ABSTRACT

A semiconductor memory having two memory circuits. In either memory circuit, memory cells and one dummy cell are connected to bit lines, respectively. When data is read from one of the memory cells connected to the bit lines of the first memory circuit, the dummy cell connected to one bit line incorporated in the second memory circuit is selected. Conversely, when data is read from one of the memory cells connected to the bit lines of the second memory circuit, the dummy cell connected to one bit line incorporated in the first memory circuit is selected. In either memory circuit, to read data from one of the memory cells, the selected bit line is precharged. Both the selected memory cell and the selected dummy cell are discharged while the data is being read from the selected memory cell.

2 Claims, 7 Drawing Sheets

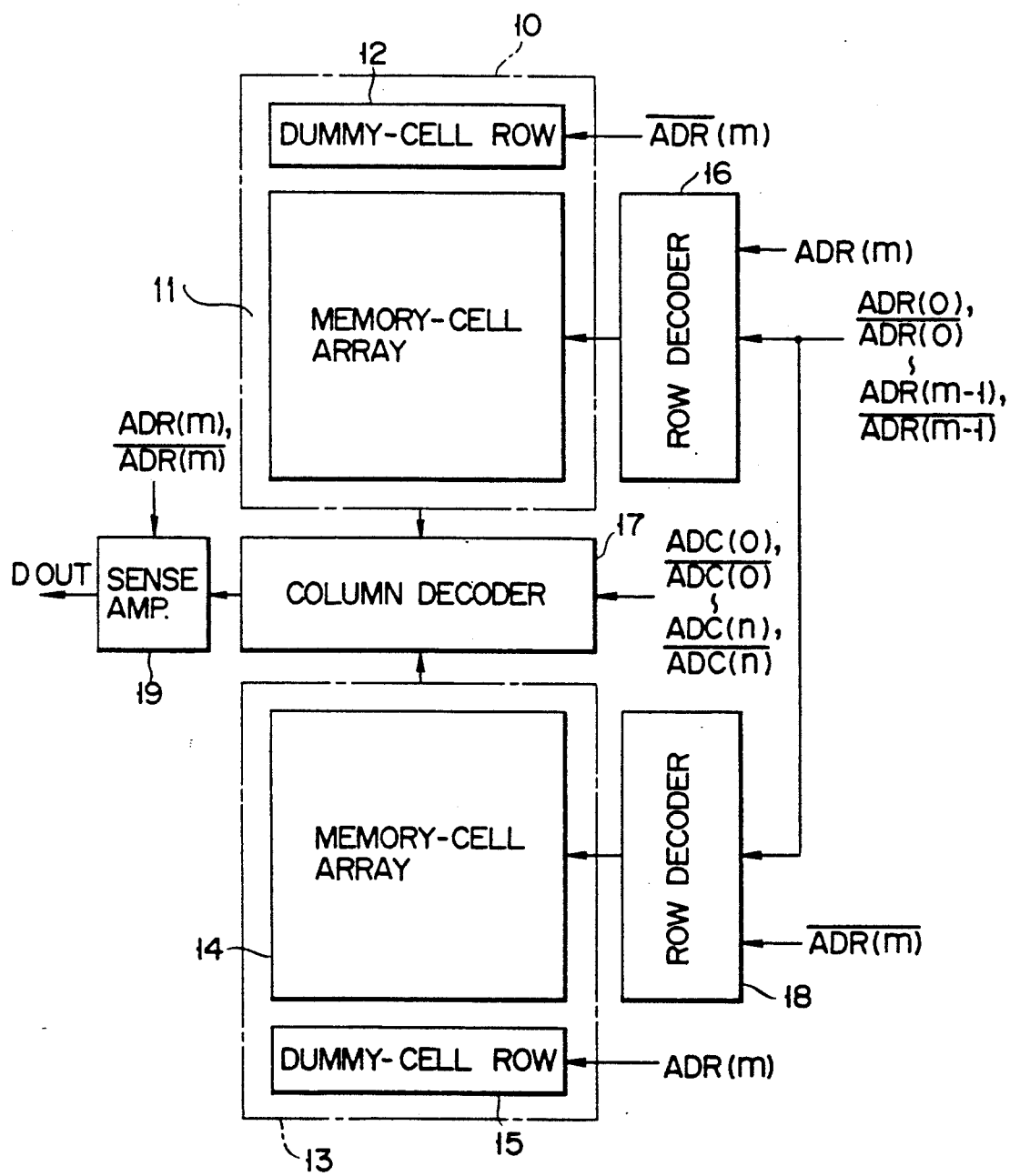
F I G. 1

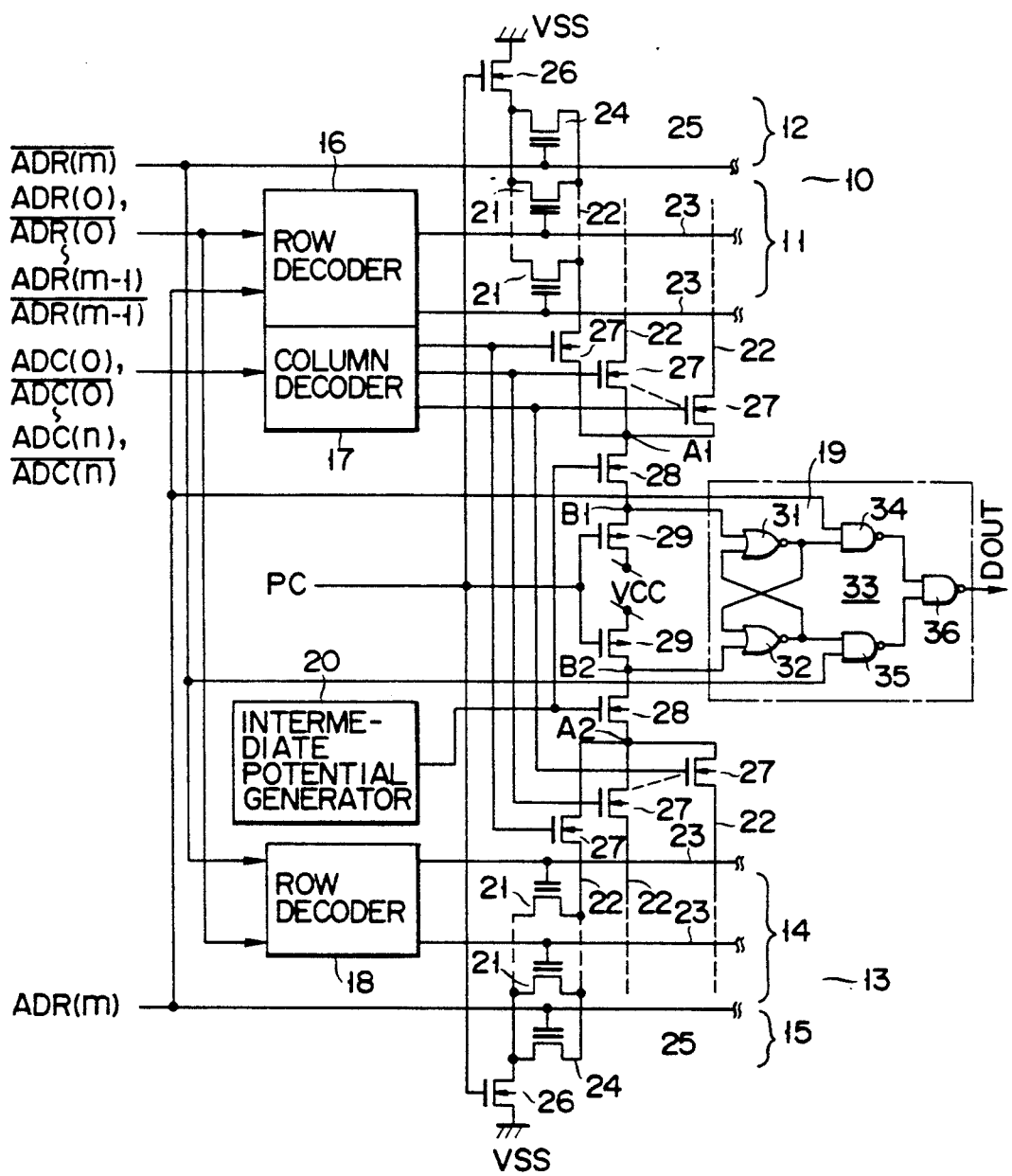
F I G. 2

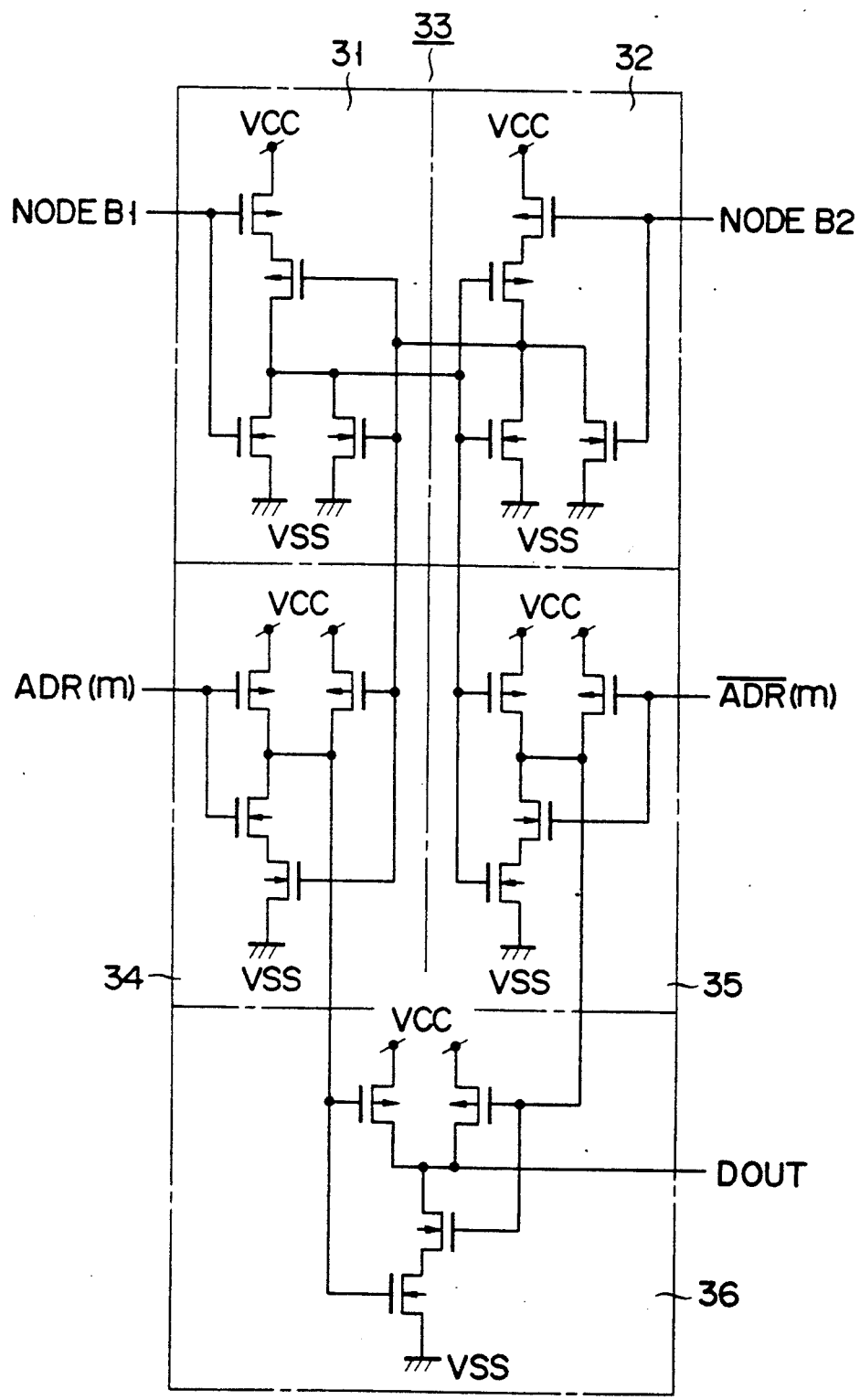
F I G. 3

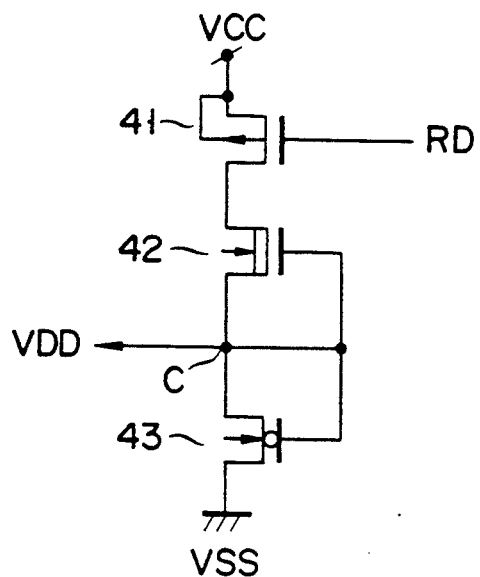
F I G. 4
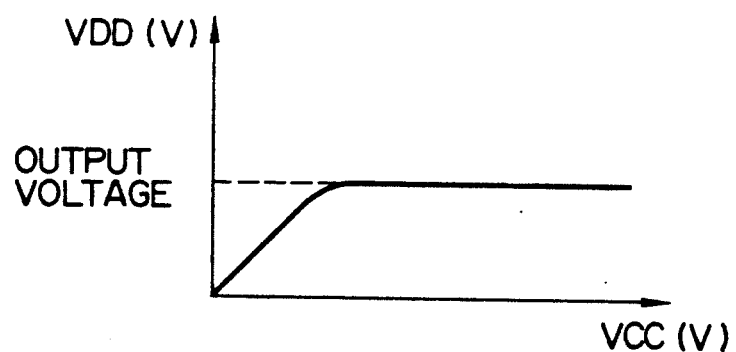
F I G. 5

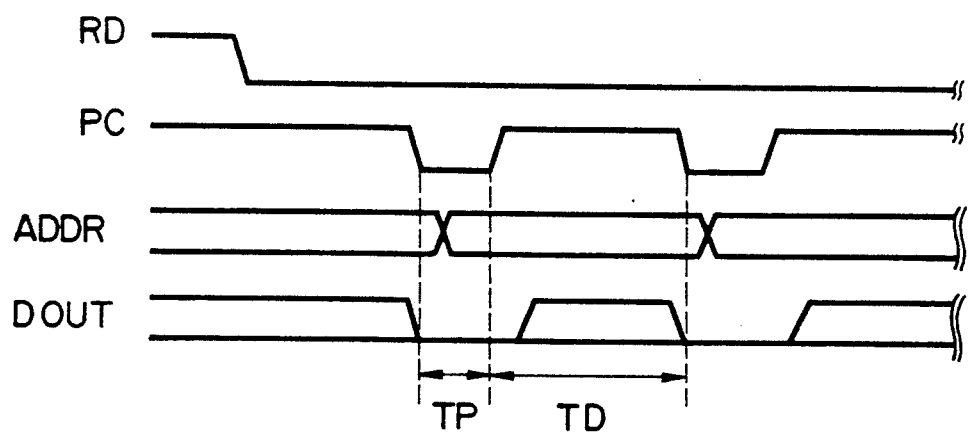
F I G. 6
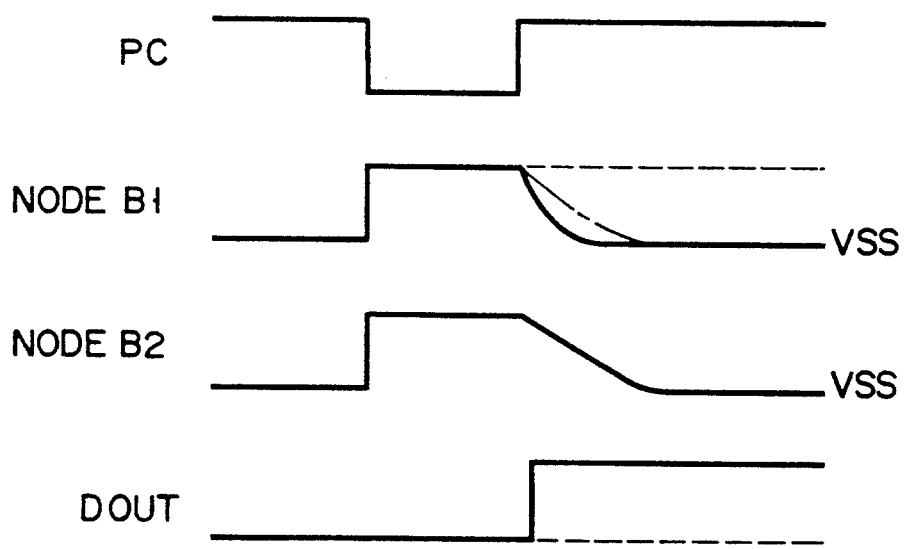
F I G. 7

NONVOLATILE SEMICONDUCTOR MEMORY WHEREIN DUMMY CELLS ARE USED FOR GENERATING A POTENTIAL FOR DETECTING DATA

BACKGROUND OF THE INVENTION

1. Field of the Invention

The present invention relates to a nonvolatile semiconductor memory comprising nonvolatile elements, such as floating-gate transistors, which are used as dummy cells.

2. Description of the Related Art

In a nonvolatile semiconductor memory comprising nonvolatile elements (e.g., floating-gate transistors) which are used as memory cells, one of the memory cells is selected in accordance with an address, and the data read from the selected memory cell is detected, thereby sensing the data stored in the memory cell. When the data is read from any selected memory cell, a DC current flows between the power supply and the ground through the selected memory cell, inevitably increasing the power consumption.

SUMMARY OF THE INVENTION

It is the object of this invention to provide a nonvolatile semiconductor memory, in which nonvolatile elements are used as memory cells, and which operates at a relatively small power consumption.

According to the invention, there is provided a nonvolatile semiconductor memory comprising: a first precharge-discharge type memory circuit having a plurality of bit lines and a plurality of nonvolatile memory cells and one nonvolatile dummy cell connected to each of the bit lines; a second precharge-discharge type memory circuit having a plurality of bit lines and a plurality of nonvolatile memory cells and one nonvolatile dummy cell connected to each of the bit lines; cell-selecting means for selecting one of the memory cells of the first memory circuit, along with the dummy cell of the second memory circuit, or one of the memory cells of the second memory circuit, along with the dummy cell of the first memory circuit; and data-detecting means for comparing a potential output from the first or second memory circuit one of the memory cells of which has been selected by the cell-selecting means, with a potential output from the memory circuit whose dummy cell has been selected by the cell-selecting means, thereby to detect data stored in the selected memory cell.

BRIEF DESCRIPTION OF THE DRAWINGS

FIG. 1 is a block diagram illustrating a non-volatile semiconductor memory according to a first embodiment of the present invention;

FIG. 2 is a circuit diagram showing, in detail, the nonvolatile semiconductor memory illustrated in FIG. 1;

FIG. 3 is a circuit diagram showing the sense amplifier incorporated in the memory shown in FIG. 2;

FIG. 4 is a circuit diagram showing, in detail, the intermediate-potential generating circuit used in the memory illustrated in FIG. 2;

FIG. 5 is a graph representing the characteristic of the circuit shown in FIG. 4;

FIG. 6 is a timing chart explaining how the nonvolatile semiconductor memory operates;

FIG. 7 is a diagram representing the waveforms of signals at various points in the nonvolatile semiconductor memory;

DETAILED DESCRIPTION OF THE PREFERRED EMBODIMENTS

Figure 8:
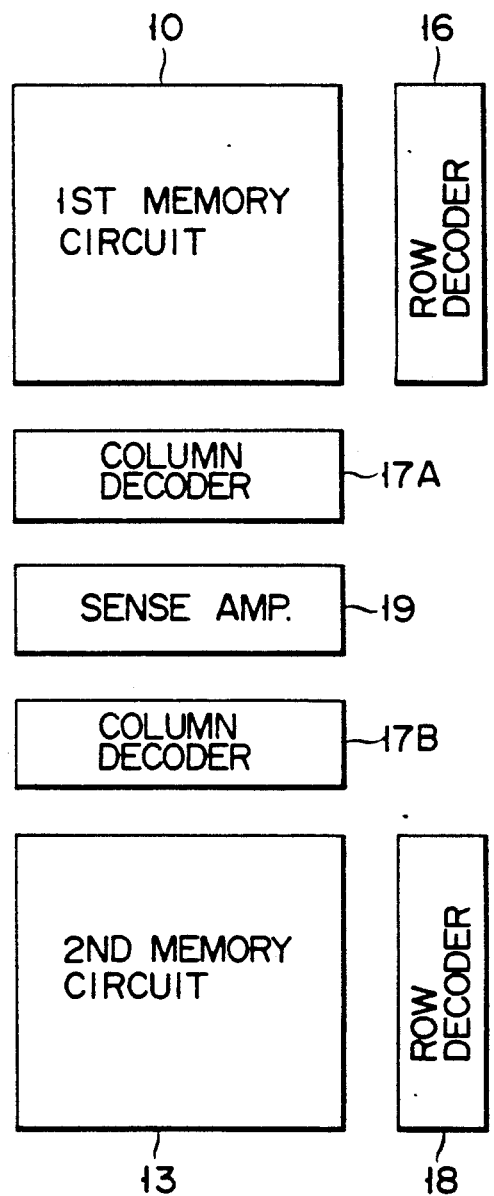
FIG. 8 shows the pattern layout of the nonvolatile semiconductor memory.

Embodiments of the present invention will now be described with reference to the accompanying drawings.

FIG. 1 is a block diagram schematically showing a nonvolatile semiconductor memory according to a first embodiment of the invention. In this figure, the data-writing circuit and some other component of the memory are not illustrated for the sake of simplicity.

As is shown in FIG. 1, the memory comprises a first memory circuit 10 and a second memory circuit 13. The first memory circuit 10 has a memory-cell array 11 and a dummy-cell row 12. The array 11 includes nonvolatile memory cells arranged in rows and columns. The dummy-cell row 12 includes dummy cells, one provided for one column of memory cells. Similarly, the second memory circuit 13 has a memory-cell array 14 and a dummy-cell row 15. The array 14 includes nonvolatile memory cells arranged in rows and columns. The dummy-cell row 15 includes dummy cells, one provided for one column of memory cells.

The semiconductor memory further comprises two row decoders 16 and 18, an one column decoder 17. The row decoder 16 is connected to receive a row-address signal consisting of m complementary bit pairs ADR(0), $\overline{ADR(0)}$, ADR(m−1), and $\overline{ADR(m-1)}$, and a one-bit row-address signal consisting of the highest bit ADR(m). The column decoder 17 is connected to receive a column-address signal consisting of n+1 complementary bit pairs ADC(0), $\overline{ADC(0)}$, ... ADC(n) and $\overline{ADC(n)}$. Any memory cell of the first memory-cell array 11 is selected by an output of the row decoder 16 and an output of the column decoder 17. Like the row decoder 16, the row decoder 18 is connected to receive a row-address signal consisting of m complementary bit pairs ADR(0), $\overline{ADR(0)}$, . . . ADR(m−1), and $\overline{ADR(m-1)}$, and a one-bit row-address signal consisting of a bit $\overline{ADR(m)}$ obtained by inverting the highest bit ADR(m). Any memory cell of the second memory-cell array 14 is selected by an output of the row decoder 18 and an output of the column decoder 17.

Both row decoders 16 and 18 are activated and controlled by the highest-bit row-address signal ADR(m) or the row-address signal $\overline{ADR(m)}$ obtained by inverting the row-address signal ADR(m). Only when activated, the row decoder 16 selects one of the word lines of the array 11, and the row decoder 18 selects the corresponding word line of the array 14. As a result of this, the memory cells of one row are selected in the first memory-cell array 11, whereas the memory cells of the corresponding row are selected in the second memory-cell array 14. The highest-bit row-address signal $\overline{ADR(m)}$ is supplied to the dummy-cell row 12 of the first memory circuit 10. The highest-bit row-address signal ADR(m) is also supplied to the dummy-cell row 15 of the second memory circuit 13. Therefore, when the row-address signal $\overline{ADR(m)}$ is activated, all dummy cells of dummy-cell rows 12 are selected simultaneously, when the row-address signal ADR(m) is activated, all dummy cells of dummy-cell rows 15 are selected simultaneously.

The potential of the memory cell of the array 11, which has been selected in accordance with the outputs of the row decoder 16 and the column decoder 17, or the potential of the memory cell of the array 14, which has been selected in accordance with the outputs of the row decoder 18 and the column decoder 17 is applied to a sense amplifier 19. Also the potential of the dummy cell of the row 12 or 15, which has been selected by the output of the column decoder 17, is applied to the sense amplifier 19.

The highest-bit row-address signals ADR(m) and $\overline{ADR(m)}$ are supplied to the sense amplifier 19, too. In accordance with these row-address signals, the sense amplifier 19 compares the potential of the selected memory cell of the first memory circuit 10 or second memory circuit 13, and also the potential of the selected dummy cell of the other memory circuit, detecting data stored in the selected memory cell. The data, thus detected, is output from the semiconductor memory as output data DOUT.

FIG. 2 is a circuit diagram illustrating, in detail, part of the semiconductor memory shown in FIG. 1.

As is shown in FIG. 2, the memory further comprises a intermediate potential generator 20 and various circuits peripheral to the memory-cell arrays 11 and 14. The generator 20 is designed to generate a potential VDD which is intermediate between the power-supply potential VCC and the ground potential VSS.

As is shown in FIG. 2, the memory-cell array 11 of the first memory circuit 10 has a plurality of memory cells 21 arranged in rows and columns, each cell comprising an N-channel floating-gate nonvolatile transistor. The drains of the memory cells 21 of each column are connected to a bit line 22, while the sources thereof are connected to one another. The control gates of the memory cells of each row are connected to a word line 23. The outputs of the row decoder 16 are connected to the word lines 23, respectively. The dummy-cell row 12 of the first memory circuit 10 comprises the same number of dummy cells 24 as the memory cells forming each row of the array 11. Like the memory cells 21, the dummy cells 24 each comprise an N-channel floating-gate nonvolatile transistor whose channel has a width-to-length ratio, W/L, substantially half that of the channel of each memory cell 21. Due to this geometrical difference, the dummy cells 24 are different from the memory cells 21 in electrical characteristics.

Each of the dummy cells 24 is connected in parallel to the memory cells 21 of the corresponding column. The control gates of all dummy cells 24 of the row 12 are connected to a dummy-word line 25. The highest-bit row-address signal $\overline{ADR(m)}$ is supplied to the dummy-word line 25. An N-channel discharge transistor 26 is connected between the ground-potential VSS and the node of the source of each dummy cell and the sources of the memory cells 21 of the corresponding column. In other words, discharge transistor are provided for the cell-column of the first memory circuit 10, in one-to-one correspondence. These discharge transistors 26 are connected to receive a precharge control signal PC at the same time.

N-channel column-selecting transistor 27 are provided for bit lines 22, respectively. Each of these transistors 27 is connected between the corresponding bit line 22 and a node A1. The gates of these transistors 27 are connected to the outputs of the column decoder 17. A level-shifting N-channel transistor 28 is connected between the node A1 and a node B1. The intermediate potential VDD is applied to the gate of this transistor 28. A precharge P-channel transistor 29 is connected between the node B1 and the power-supply potential VCC, and is turned on by a precharge control signal PC.

The second memory circuit 13 is identical to the first memory circuit 10, except for two points. First, the row-address signal ADR(m), not the signal $\overline{ADR(m)}$, is supplied to the dummy-word line 25 to which the control gates of the dummy cells 24 forming the row 15. Second, the word lines 23 are connected to the outputs of the row decoder 18, not to the outputs of the row decoder 16. The second memory circuit 13 has nodes A2 and B2 which correspond to the nodes A1 and B1, respectively.

In both the first memory circuit 10 and the second memory circuit 13, no data is written into the dummy cells 24. In other words, no electrons are injected in their floating gates, and threshold voltage of the dummy cells 24 remains low.

As is shown in FIG. 2, the sense amplifier 19 comprises a flip-flop circuit 33, and three NAND gates 34, 35, and 36. The flip-flop circuit 33 is comprised of two NOR gates 31 and 32. The output of the NOR gate 31 is connected to one input of the NOR gate 32, whereas the output of the NOR gate 32 are connected to one input of the NOR gate 31. The other input of the NOR gate 31 is coupled to the node Bl, and the other input of the NOR gate 32 is connected to the node B2. The outputs of the flip-flop circuit 33 are connected to one input of the NAND gate 34 and also to one input of the NAND gate 35, respectively. The row-address signal ADR(m) is supplied to the other input of the NAND gate 34, whereas the row-address signal $\overline{ADR(m)}$ is supplied to the other input of the NAND gate 35. The outputs of both NAND gates 34 and 35 are input to the NAND gate 36, which outputs the data DOUT. As is illustrated in FIG. 3, the NOR gates 31, 32 and the NAND gates 34, 35, and 36 are CMOS circuits.

The intermediate potential generator 20 has, for example, the structure shown in FIG. 4. As FIG. 4 shows, the generator 20 comprises a P-channel transistor 41, a depletion-type N-channel transistor 42, and an intrinsic N-channel transistor 43, which are connected in series between the power-supply potential VCC and the ground potential VSS. The intrinsic N-channel transistor 43 has a threshold voltage which is substantially 0 V. The gate of the transistor 41 is connected to receive a read control signal RD. The gates of the transistors 42 and 43 are connected together, forming a node C. It is from this node C that the intermediate potential VDD is output.

When the read control signal RD falls to a "L" level, turning on the transistor 41, the intermediate potential VDD is generated at the node C which is intermediate between the power-supply potential VCC and the ground potential VSS. Since the gates of the transistors 42 and 43 are connected to each other at the node C, the intermediate potential VDD remains unchanged even if the power-supply potential VCC varies to some degree, as can be understood from the graph illustrated in FIG. 5.

It should be noted that all transistors shown in FIGS. 2, 3, and 4 are of enhancement type, unless otherwise specified.

With reference to the timing chart of FIG. 6, it will now be explained how the memory described above operates.

When the read control signal RD falls to the "L" level, the intermediate potential generator 20 is driven, generating the intermediate potential VDD. As a result of this, data can be read from the memory cells. When the precharge control signal PC falls to the "L" level thereafter, the precharge transistors 29 incorporated in both memory circuits 10 and 13 are turned on. The nodes B1 and B2 are thereby precharged for a period TP (FIG. 6) to the power-supply potential VCC. The discharge transistors 26 of both memory circuits 10 and 13 are, therefore, turned off, and DC currents flow between the two point where the potentials VCC and VSS are applied, respectively. The nodes B1 and B2 are at the potential VCC; namely they are set at a "H" level. Hence, the flip-flop circuit 33 incorporated in the sense amplifier 19 is reset. The output of the flip-flop circuit 33 falls to the "L" level, and the output data DOUT falls to the "L" level.

Next, new row-address signals are input to the row decoders 16 and 18, and new column-address signals are input to the column decoder 17. If the highest-bit row-address signals ADR(m) and $\overline{ADR(m)}$ are at the "H" level and the "L" level, respectively, at this time, the row-decoder 16 is activated, selecting one of the word lines 23 of the first memory circuit 10. In this case, one of the memory cells 21 of the array 11 is selected in accordance with the outputs of the row decoder 16 and the column decoder 17. Since the other row decoder 18 is not activated, none of the memory cells 21 of the second memory circuit 13 is selected. Since the address signal ADR(m) is at the "H" level, however, the dummy-word line 25 of the second memory circuit 13 is driven, whereby all dummy cells 24 of the row 15 are selected at the same time.

Thereafter, when the precharge control signal PC rises from the "L" level to the "H" level, both precharge transistors 29 are turned off. Hence, the discharge transistors 26 of both memory circuits 10 and 13 are turned on. The transistors 26 remain on for a period TD (FIG. 6) assuming that the selected memory cell 21 stores data "1", and that no electrons are injected in the floating gate of the selected cell 21. Then, the threshold voltage of this memory cell 21 is held low. Hence, when the word line 23 is selected and driven, the memory cell 21 is turned on, and the node B1 held at a high potential is discharged to the ground potential VSS. Meanwhile, in the second memory circuit 13, the node B2 is discharged to the ground potential VSS through the column-selecting transistor 27, the dummy memory cell 24, and the discharge transistor 26, the transistor 27 having been turned on by the output of the column decoder 17. The speed at which the potentials at both nodes B1 and B2 decrease along with the discharging of the column-selecting transistor 27 is determined by the electrical characteristics of the selected memory cell 21 and the selected dummy cell 24. The sense amplifier 19 compares the decrease of the potential at the node B1 with that of the potential at the node B2, thereby determining the level of the output data DOUT. In the sense amplifier 19, the address signal ADR(m) opens the NAND gate 34, thus selecting the output of the NOR gate 31 which is connected to the first memory circuit 10 including the selected memory cell 21. The output of the NAND gate 35, which receives the output of the NOR gate 32 coupled to the second memory circuit 13 whose memory cells have not been selected, is held at the "H" level by means of the address signal $\overline{ADR(m)}$. On the other hand, if the highest-bit row-address signal ADR(m) and the highest-bit row-address signal $\overline{ADR(m)}$ are at the "L" level and the "H" level, respectively, the row decoder 18 is activated, driving one of the word lines 23 of the second memory circuit 13. As a result of this, one of the memory cells 21 of the second memory circuit 13 is selected. Further, the row-address signal $\overline{ADR(m)}$ on the dummy word line 25 selects all dummy cells 24 of the row 12 incorporated in the first memory circuit 10. The sense amplifier 19 compares the change in the potential of the node B1 and the change in the potential of the node B2, thereby determining the level of the output node B2, thereby determining the level of the output data DOUT.

In either memory circuit, the same number of memory cells 21 and one dummy cell 24 are connected to each bit line 22. Each memory cell 21 and dummy cell 24 have the same parasitic capacitance, regardless of the storage capacity of the memory, which varies with the number of the memory cells connected to the same bit line. This is because the parasitic capacitances of the memory cells 21 and the dummy cell 24 depend on the bit line to which the cells 21 and 24 are connected. Hence, the bit line to which the selected memory cell 21 is connected always has a parasitic capacitance which is equal to the parasitic capacitance of the bit line to which the selected dummy cell 24 is connected. The sense amplifier 19 therefore compares the changes in the potentials at the nodes B1 and B2, which depend on only the difference in electrical characteristics between the selected memory cell 21 and the selected dummy cell 24. Thus, the sense amplifier 19 can correctly detect the data which is stored in the selected memory cell 21.

As has been described, the nonvolatile semiconductor memory described above is characterized in two respects. First, the bit lines are precharged before the data is read from the nonvolatile semiconductor memory, and are discharged in order to read the data. Second, the sense amplifier 19 comprises CMOS circuits. Because of these features, the memory consumes a relatively small amount of power. Although the intermediate potential generator 20 consumes power during the data-reading period, the power consumption can be reduced by imparting a high impedance to the generator 20.

With reference to the waveform diagram shown in FIG. 7, it will now be explained how data is read from the nonvolatile semiconductor memory described above.

When the precharge control signal PC is made to fall to the "L" level in order to read the data from the memory, the precharge transistors 29 are turned on. Both the node B1 of the first memory circuit 10 and the node B2 of the second memory circuit 13 are precharged to the "H" level, i.e., the power-supply potential VCC. A potential lower than the potential VCC is applied to the nodes A1 and A2 since the generator 20 applies the intermediate potential VDD to the gates of the level-shifting transistors 28. A potential lower than the power-supply potential VCC is applied to the drains of the memory cells 21 and dummy cells 24 of both circuits 10 and 13. Therefore, an intense electrical field can break down neither the memory cells 21 nor the dummy cells 24, however small the cells 21 and 24 are made.

When the precharge control signal PC rises to the "H" level, both discharge transistors 26 are turned on. Further, one of the memory cells 21 of the first memory circuit 10 or the second memory circuit 13 is selected in accordance with the ne row-address signals and the new column-address signals.

If one of the memory cells 21 of the first memory circuit 10 is selected, and that data "0" has been written into the selected cell 21, and electrons are injected in the floating gate thereof. In this case, the selected memory cell 21 remains off, whereby both the bit line 22 and the node A1 remain precharged. It follows that the node B1 also remains precharged as is indicated by the broken line in FIG. 7. Thus, data "0" is read from the selected memory cell 21. Conversely, if data "1" has been written into the selected memory cell 21, and no electrons are injected in the floating gate of thereof, the cell 21 is turned on, whereby the bit line 22 and the node A1 are discharged to the ground potential VSS. Thus, data "1" is read from the selected memory cell 21. The node B1 is also discharged to the ground potential VSS, as is indicated by the solid line in FIG. 7.

In the second memory circuit 13, wherein one of the dummy cells 24 is selected, the transistor 29 is turned on, and the node B2 is precharged to the "H" level, when the precharge control signal PC is at the "L" level. When the precharge control signal PC rises to the "H" level thereafter, the transistor 26 is turned on. All dummy cells 24 are turned on by the signal on the dummy word line 25, whereby the bit lines 22 are discharged to the ground potential VSS. The potential of the node B2 decreases to the potential VSS more slowly than the potential of the node B1 decreases to the potential VSS when any memory cell 21 storing data "1" is selected. This is because the width-to-length ratio W/L of the channel of the dummy cells 24 is about half that of the memory cells 21. As a result, the flip-flop circuit 33 of the sense amplifier 19 either remains reset or is set, depending on the difference between the potentials of the nodes B1 and B2, whereby the sense amplifier 19 detects the data stored in the selected memory cell 21.

In the embodiment described above, one dummy cell 24 and the same number of memory cells 21 are connected to each bit line 22 of either memory circuit. Hence, as is indicated by the one-dot, one-dash line in FIG. 7, the potential detected from the memory circuit including the selected dummy cell is always intermediate between the two values it has when data "1" and data "0" are read from the other memory circuit, respectively, no matter how large is the storage capacity of the memory. This is because, as has been pointed out, the width-to-length ratio W/L of the channel of the dummy cells 24 is about half that of the memory cells 21. Hence, the sense amplifier 19 can reliably detect the data stored in any selected memory cell 21, regardless of the storage capacity of the memory.

Even if the power-supply voltage varies, the potential corresponding to the data read from the dummy cell falls within the range between the potentials corresponding to data "1" and "0" read from any memory cell. Hence, the semiconductor memory can operate with power-supply voltages over a broad range.

FIG. 8 shows the pattern layout of the nonvolatile semiconductor memory which has been manufactured in the form of an integrated circuit. As is evident from FIG. 8, the sense amplifier 19 is arranged between the first memory circuit 10 and the second memory circuit 13. Thus, the connector connecting the sense amplifier 19 to the first memory circuit 10, and the connector connecting the amplifier 19 to the second memory circuit 13 have the same length. The connectors therefore have the same parasitic capacitance, and the two inputs can be supplied to the sense amplifier 19 under the same condition. The column decoder 17 is divided into two sections 17A and 17B, between which the sense amplifier 19 is located.

Figure 9:
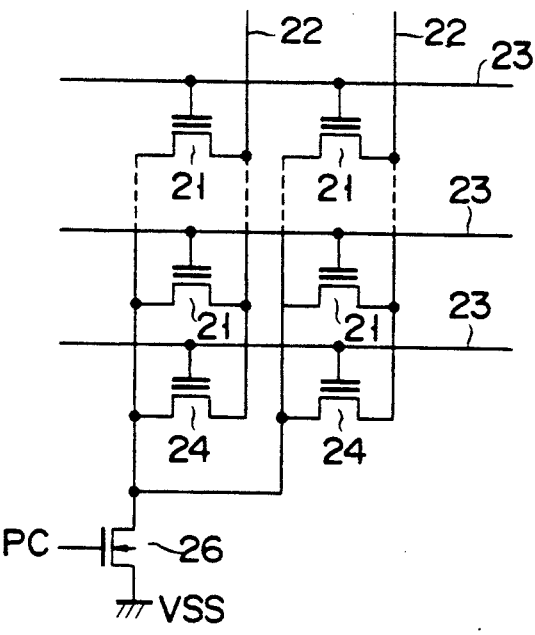
FIG. 9 is a circuit diagram illustrating part of a nonvolatile semiconductor memory according to a second embodiment of the invention.

A nonvolatile semiconductor memory according to a second embodiment of the invention will be described. In the first embodiment, one discharge transistor 26 is provided for each of the bit lines in either memory circuit. In the second embodiment, one discharge transistor 26 is provided for every two or more bit lines. For example, as is shown in FIG. 9, the sources of memory cells 21 and one dummy cell 24, which are connected to a bit line 22, and the sources of memory cells 21 and one dummy cell 24, which are connected to another bit line 22 are connected to the drain of one discharge transistor 26. Needless to say, the gate of this discharge transistor 26 is connected to receive a precharge control signal PC.

Figure 10:
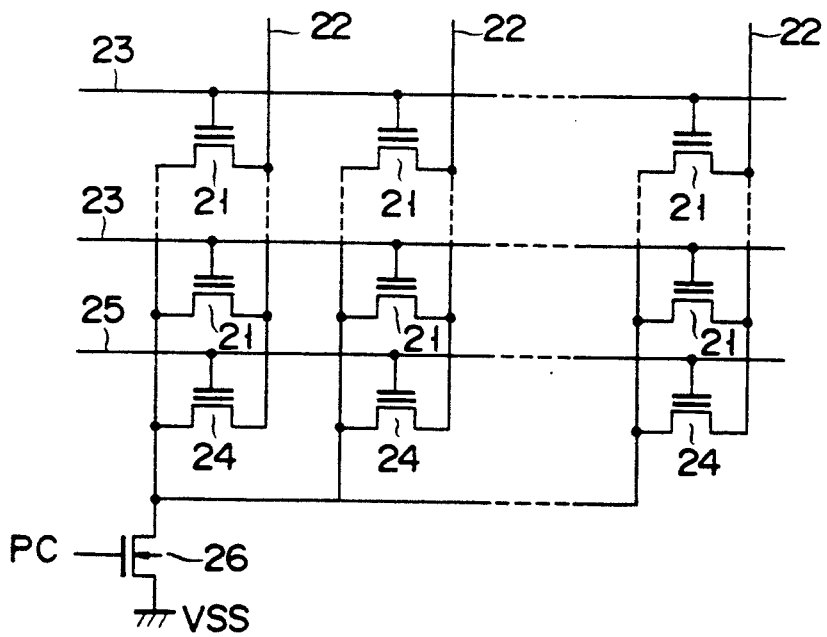
FIG. 10 is a circuit diagram showing part of a nonvolatile semiconductor memory according to a third embodiment of the invention.

FIG. 10 is a circuit diagram showing part of a nonvolatile semiconductor memory according to a third embodiment of the invention. In this embodiment, only one discharge transistor 26 is provided in either the first memory circuit 10 or the second memory circuit 13. More specifically, in the circuit 10 or 13, the sources of many memory cells 21 and the source of one dummy cell 24, which are coupled to any bit line 22 are connected to the drain of the single discharge transistor 26. Also in this case, the gate of the discharge transistor 26 is connected to receive the precharge control signal PC.

In the circuits of FIGS. 9 and 10, wherein two or more bit lines share one discharge transistor 26, the first memory circuit 10 or the second memory circuit 13 comprises less elements than its counterpart used in the first embodiment. Hence, the memory of the second or third embodiment can have a smaller chip size than the memory according to the first embodiment.

The present invention is not limited to the three embodiments described above. Various changes and modifications can be devised, without departing the scope of the invention. For instance, the level-shifting transistor 28, which is an enhancement-type transistor connected between the nodes A1 and B1 or between the nodes A2 and B2, can be replaced by an intrinsic-type transistor. If this is the case, the potential applied to the bit lines can be substantially constant even if the transistors 28 have different characteristics due to errors made in the process of manufacturing the semiconductor memory, and the semiconductor memory can be manufactured at a sufficiently high yield.

What is claimed is:

1. A nonvolatile semiconductor memory comprising:
a first precharge-discharge type memory circuit having a first plurality of bit lines, a first plurality of non-volatile memory cells and at least one nonvolatile dummy cell connected to said first plurality of bit lies;
a second precharge-discharge type memory circuit having a second plurality of bit lines and a second plurality of nonvolatile memory cells and at least one nonvolatile dummy cell connected to the second plurality of bit lines of the second memory circuit;

cell-selecting means for selecting one of the first plurality of nonvolatile memory cells of the first memory circuit, along with one of the at least one dummy cell of the second memory circuit, or one of the second plurality of memory cells of the second memory circuit, along with one of the at least one dummy cell of the first memory circuit;

data-detecting means for comparing a potential output from the first or second memory circuit including the selected memory cell, respectively with a potential output from the first or second memory circuit including the dummy cell which has been selected by the cell-selecting means, thereby to detect data stored in the selected memory cell;

first and second bit-line selecting circuits included in the cell selecting means, each comprising a plurality of bit-line selecting transistors connected, at a first end, to said bit lines in each memory circuit, respectively, and connected to one another at a second end in each memory circuit, thus forming a node in each memory circuit, and a column decoder for receiving the column-address signals and for selecting and driving one of said bit-line selecting transistors in accordance with the column-address signals;

a plurality of level-shifting transistors each connected at a first end to the node at the second ends of said plurality of bit-line selecting transistors for each memory circuit; and a plurality of precharge transistors each respectively connected at a first end to a second end of each of said plurality of level-shifting transistors.

2. A nonvolatile semiconductor memory comprising;

a first precharge-discharge type memory circuit having a first plurality of bit liens, a first plurality of nonvolatile memory cells and a first at least one nonvolatile dummy cell connected to the first plurality of bit lines, said first at least one dummy cell having an electrical characteristic different from that of the first plurality nonvolatile memory cells, a first plurality of word lines for selecting the first plurality nonvolatile memory cells, and a dummy word line for simultaneously selecting the first at least one nonvolatile dummy cell connected to said first plurality of bit lines, respectively;

a second precharge-discharge type memory circuit having a second plurality of bit lines, a second plurality of nonvolatile memory cells and a second at least one nonvolatile dummy cell connected to the second plurality of bit lines, said second at least one dummy cell having an electrical characteristic different from that of the second plurality of nonvolatile memory cells, a second plurality of word lines for selecting the second plurality of nonvolatile memory cells, and a dummy word line for simultaneously selecting the second at least one nonvolatile dummy cell connected to said second plurality of bit lines, respectively;

cell-selecting means for selecting one of the first plurality of nonvolatile emory cells of the first memory circuit, along with the second at least one nonvolatile dummy cell of the second memory circuit, or one of the second plurality of nonvolatile memory cells of the second memory circuit, along with the first at least one nonvolatile dummy cell of the first memory circuit, thereby to read data from the selected nonvolatile memory cell;

data-detecting means for comparing a potential output from the first or second memory circuit including the nonvolatile memory cell which has been selected by the cell-selecting means, respectively with a potential output from the first or second memory circuit including the nonvolatile dummy cell which has been selected by the cell-selecting means, thereby to detect data stored in the selected nonvolatile memory cell;

first and second bit-line selecting circuits included in the cell selecting means, each comprising a plurality of bit-line selecting transistors connected, at a first end, to said bit lines in each memory circuit, respectively, and connected to each other at a second end in each memory circuit, thus forming a node in each memory circuit, and a column decoder for receiving the column-address signals and for selecting and driving one of said bit-line selecting transistors in accordance with the column-address signals;

a plurality of level-shifting transistors each connected, at a first end to the node at the second ends of said bit-line selecting transistors for each memory circuit; and a plurality of precharge transistors each connected, at a first end, to a second end of each of said plurality of level-shifting transistors.

* * * * *

UNITED STATES PATENT AND TRADEMARK OFFICE
CERTIFICATE OF CORRECTION

PATENT NO. : 5,229,968
DATED : July 20, 1993
INVENTOR(S) : Makoto Ito et al.

It is certified that error appears in the above-indentified patent and that said Letters Patent is hereby corrected as shown below:

Claim 1, column 8, line 64, change "lies" to --lines--.

Claim 2, column 9, line 35, change "comprising;" to --comprising:--.

Claim 2, column 9, line 37, change "liens" to --lines--.

Claim 2, column 10, line 13, change "emory" to --memory--.

Signed and Sealed this

Seventh Day of June, 1994

Attest:

BRUCE LEHMAN

Attesting Officer

Commissioner of Patents and Trademarks